US007811660B2

(12) United States Patent
Kaneshiro et al.

(10) Patent No.: US 7,811,660 B2
(45) Date of Patent: Oct. 12, 2010

(54) POLYIMIDE FILM HAVING HIGH ADHESIVENESS AND METHOD FOR PRODUCING SAME

(75) Inventors: Hisayasu Kaneshiro, Uji (JP); Hiroyuki Tsuji, Yokohama (JP); Takashi Kikuchi, Otsu (JP)

(73) Assignee: Kaneka Corporation, Osaki-Shi, Osaka (JP)

( * ) Notice: Subject to any disclaimer, the term of this patent is extended or adjusted under 35 U.S.C. 154(b) by 365 days.

(21) Appl. No.: 11/698,656

(22) Filed: Jan. 26, 2007

(65) Prior Publication Data

US 2007/0179271 A1 Aug. 2, 2007

Related U.S. Application Data

(63) Continuation-in-part of application No. PCT/JP2005/013738, filed on Jul. 27, 2005, now abandoned.

(51) Int. Cl.
*C08J 5/18* (2006.01)
*C08G 73/10* (2006.01)
*C08L 79/08* (2006.01)

(52) U.S. Cl. ............... 428/220; 428/473.5; 525/432; 525/436; 528/335; 528/338; 528/340; 528/342; 528/347; 528/348; 528/350; 528/353

(58) Field of Classification Search ............ 428/220, 428/473.5; 525/432, 436; 528/335, 338, 528/340, 342, 347, 348, 350, 353
See application file for complete search history.

(56) References Cited

U.S. PATENT DOCUMENTS

| 5,412,066 | A | * | 5/1995 | Hergenrother et al. | ...... 528/353 |
| 5,502,143 | A | * | 3/1996 | Oie et al. | ...... 528/12 |
| 5,908,334 | A | * | 6/1999 | Chen et al. | ...... 439/824 |
| 5,990,553 | A | * | 11/1999 | Morita et al. | ...... 257/729 |

FOREIGN PATENT DOCUMENTS

| JP | 04-161437 | 6/1992 |
| JP | 05-105850 | 4/1993 |
| JP | 05-222219 | 8/1993 |
| JP | 06-032926 | 2/1994 |
| JP | 11-071457 | 3/1999 |
| JP | 11-158276 | 6/1999 |
| JP | 2000-080178 | 3/2000 |
| JP | 2000-119521 | 4/2000 |
| JP | 2001-040108 | 2/2001 |

OTHER PUBLICATIONS

Patent Abstracts of Japan, Publication No. 11-071457, Mar. 16, 1999, (1 pg).
Patent Abstracts of Japan, Publication No. 04-161437, Jun. 4, 1992, (1 pg).
Patent Abstracts of Japan, Publication No. 05-105850, Apr. 27, 1993, (1 pg).
Patent Abstracts of Japan, Publication No. 2001-040108, Feb. 13, 2001, (1 pg).
International Search Report, Oct. 11, 2005, (2 pgs).
English Translation of PCT International Preliminary Report on Patentability, Jul. 27, 2005 (5 pgs).
Patent Abstracts of Japan, Publication No. JP 05-222219, Aug. 31, 1993, 1 pg.
Patent Abstracts of Japan, Publication No. JP 06-032926, Feb. 8, 1994, 1 pg.
Patent Abstracts of Japan, Publication No. JP 2000-080178, Mar. 21, 2000, 1 pg.
Patent Abstracts of Japan, Publication No. JP 2000-119521, Apr. 25, 2000, 1 pg.
Patent Abstracts of Japan, Publication No. JP 11-158276, Jun. 15, 1999, 1 pg.

\* cited by examiner

*Primary Examiner*—Ana L Woodward
(74) *Attorney, Agent, or Firm*—Kagan Binder, PLLC

(57) ABSTRACT

A non-thermoplastic polyimide film exhibits high adherability without expensive surface treatment and is made from a precursor solution having high storage stability. The non-thermoplastic polyimide film comprises a non-thermoplastic polyimide resin having a block component derived from a thermoplastic polyimide. Preferably, the block component of the thermoplastic polyimide is present in an amount of 20 to 60 mol % of the entire polyimide so that the precursor solution thereof exhibits high storage stability and that the film can exhibit high adherability, in particular, high adherability to polyimide adhesives.

14 Claims, No Drawings

POLYIMIDE FILM HAVING HIGH ADHESIVENESS AND METHOD FOR PRODUCING SAME

This is a continuation-in-part of International Application PCT/JP2005/013738, with an international filing date of Jul. 27, 2005, now abandoned, the contents of which are incorporated herein by reference.

TECHNICAL FIELD

The present invention relates to a non-thermoplastic polyimide film that exhibits a property that allows adhesives, in particular, an adhesive containing a thermoplastic polyimide, to adhere thereto with high adhesion. Hereinafter, this property is sometimes referred to as "adherability." High adherability is particularly observed when adhesives containing a thermoplastic polyimide are used with the present films.

BACKGROUND ART

The recent trends toward lighter, smaller, and higher-density electronic products have increased the demand for various printing boards. In particular, the demand for flexible laminates (also referred to as "flexible printing circuit boards (FPCs)") has shown a notable increase. A flexible laminate is constituted from an insulating film and a circuit formed from a metal foil disposed on the film.

A typical flexible laminate is produced by bonding a metal foil onto a surface of a substrate, with an adhesive material under heating and pressure, the substrate being a flexible film composed of an insulating material of various kinds. Polyimide films and the like are preferred as the insulating flexible film, and thermosetting adhesives such as epoxy and acrylic adhesives are typically used as the adhesive material. Hereinafter, FPCs made using thermosetting adhesives are also referred to as "three-layer FPCs".

Thermosetting adhesives are advantageous in that bonding at relatively low temperatures is possible. However, requirements for properties, such as heat resistance, flexibility, and electrical reliability, are becoming more stringent, and it is possible that three-layer FPCs using thermosetting adhesives will have difficulty in meeting these stringent requirements. In order to overcome this problem, FPCs (hereinafter also referred to as "two-layer FPCs") using thermoplastic polyimide as the bonding layer or made by directly forming a metal layer on the insulating film have been proposed. The two-layer FPCs have properties superior to those of the three-layer FPCs, and the demand for the two-layer FPCs is expected to grow in the future.

Various techniques have been proposed to improve adherability of polyimide. For example, a technique of subjecting a polyimide film to a low-temperature plasma treatment and then to modification treatment using alkaline chemicals and a technique of adding a particular metal component to the polyimide film and subjecting the resulting film to high-temperature treatment have been known (see Patent Documents 1 and 2, cited below). However, polyimide films have low adherability to thermoplastic polyimide-based adhesive materials, and the adherability of the polyimide films is still insufficient even after such treatment. Plasma treatment is effective for improving the adherability of the film to the polyimide-based adhesive materials, but sufficient effects cannot be obtained unless a proper resin composition is selected for the polyimide film (see Patent Document 3).

Another approach disclosed is to control the polymerization process of polyamic acid used for the production of the polyimide film so as to control the linear expansion coefficient, the elasticity modulus, and the like of the polyimide film.

For example, the following process is known as the process for preliminarily preparing block components by polymerization: polyamic acid is prepared from phenylenediamine and pyromellitic dianhydride or from phenylene diamine and 3,3'-4,4'-benzophenonetetracarboxylic acid by polymerization to form their block component and subsequently adding an imidizing agent thereto to prepare a copolymerized polyimide containing the block components (see Patent Documents 4 and 5). However, this process uses rigid monomers and the product does not contain any thermoplastic block component. A technique of controlling the block component in view of obtaining high adherability to various adhesives, in particular, polyimide adhesive materials which have had difficulty in adhering to the films prepared by the related art, has not been known so far.

Patent Document 1: Japanese Unexamined Patent Application Publication No. 5-222219

Patent Document 2: Japanese Unexamined Patent Application Publication No. 6-32926

Patent Document 3: Japanese Unexamined Patent Application Publication No. 1-158276

Patent Document 4: Japanese Unexamined Patent Application Publication No. 2000-80178

Patent Document 5: Japanese Unexamined Patent Application Publication No. 2000-119521

DISCLOSURE OF INVENTION

Problems to be Solved by the Invention

The present invention has been made under the above-described circumstances. An object of the present invention is to provide a polyimide film that will exhibit adherability to adhesives, in particular, polyimide adhesives.

Means for Solving the Problems

To achieve this object, the present inventors have conducted extensive studies and found that a polyimide film containing a polyimide whose molecules are adequately designed exhibits high adherability to adhesives, in particular, polyimide adhesives. The present invention has been made based on this finding.

In particular, the present invention can solve the above-described problem by providing a novel polyimide film in accordance with any of the embodiments described below:

1) A non-thermoplastic polyimide film containing a non-thermoplastic polyimide resin having a block component derived from a thermoplastic polyimide;

2) The non-thermoplastic polyimide film described in 1), in which the thermoplastic block component is present in an amount of 20 to 60 mol % of the entire non-thermoplastic polyimide resin;

3) The non-thermoplastic polyimide film described in 1) or 2), in which the diamine component in the thermoplastic polyimide block component contains 2,2-bis(4-aminophenoxyphenyl)propane;

4) The non-thermoplastic polyimide film described in one of 1) to 3), in which the acid component in the thermoplastic polyimide block component contains a benzophenonetetracarboxylic acid and/or a biphenyltetracarboxylic acid;

5) The non-thermoplastic polyimide film described in one of 1) to 4), in which the number n of repeating units of the thermoplastic polyimide block component is 3 to 99;

6) The non-thermoplastic polyimide film described in 5), in which the number n of repeating units of the thermoplastic polyimide block component is 4 to 90;

7) The non-thermoplastic polyimide film described in one of 1) to 6), in which the non-thermoplastic polyimide film is a polyimide film consisting of a non-thermoplastic polyimide resin having a block component derived from a thermoplastic polyimide;

8) The non-thermoplastic polyimide film described in one of 1) to 6), further comprising a filler;

9) The non-thermoplastic polyimide film described in 8), wherein the non-thermoplastic polyimide resin is 50 wt % or more of the film.

10) The non-thermoplastic polyimide film described in 8), wherein the filler is 50 wt % or less of the film.

11) A non-thermoplastic polyimide film comprising:
a non-thermoplastic polyimide resin having at least one residue unit derived from a compound having diamine functionality and at least one residue unit derived from a compound having acid dianhydride functionality,
wherein either the residue unit derived from a compound having diamine functionality or the residue unit derived from a compound having acid dianhydride functionality has at least one amic acid group and exhibits a thermoplastic character when bound linearly using pyromellitic acid dianhydride (in the case of the compound having diamine functionality) or p-phenylenediamine (in the case of the compound having acid dianhydride functionality) and then imidized.

12) A non-thermoplastic polyimide film comprising:
a non-thermoplastic polyimide resin having at least one residue unit derived from a compound having diamine functionality and at least one residue unit derived from a compound having acid dianhydride functionality,
wherein either the residue unit derived from a compound having diamine functionality or the residue unit derived from a compound having acid dianhydride functionality has at least one imide group and exhibits a thermoplastic character when bound linearly using pyromellitic acid dianhydride (in the case of the compound having diamine functionality) or p-phenylenediamine (in the case of the compound having acid dianhydride functionality) and then imidized.

13) A non-thermoplastic polyimide film made from monomer components polymerized in an arrangement that provides thermoplastic polyimide regions having the following properties as compared to a comparative film having the same monomer components that are randomly polymerized:
  i) the non-thermoplastic polyimide film has an elasticity modulus higher than that of the comparative film by at least 0.3 GPa;
  ii) the non-thermoplastic polyimide film has a linear expansion coefficient and moisture expansion coefficient smaller than those of the comparative film by at least 1 ppm;
  iii) the non-thermoplastic polyimide film and the comparative film maintain substantially the same tensile elongation;
  iv) the storage elasticity modulus of the non-thermoplastic polyimide film at 380° C. determined by dynamic viscoelasticity analysis is lower than that of the comparative film by at least 0.1 GPa; and
  v) the tan δ peak value of the non-thermoplastic polyimide film is larger than that of the comparative film by at least 0.01.

The present invention improves the adherability of a flexible, metal-clad laminate in which metal foils are laminated with various adhesives. In particular, high adherability allows the film to be applicable to the fine wiring patterns required for high-density mount processes. Moreover, since the problem of low adherability that accompanies thermoplastic polyimide adhesives can be resolved, the film is particularly useful for use with lead-free soldering exhibiting high reflow temperatures.

An embodiment of the present invention will now be described. A non-thermoplastic polyimide film of the present invention contains a non-thermoplastic polyimide resin containing a block component derived from a thermoplastic polyimide. The present inventors have studied various molecular designs for polyimide in order to improve the adherability of the polyimide film and found that a non-thermoplastic polyimide film can exhibit high adherability to adhesives by molecular design of the polyimide in which a block component derived from a thermoplastic polyimide is contained in the polyimide resin. The present inventors are first to find that the adherability of a non-thermoplastic polyimide film can be improved by the molecular design.

The polyimide film of the present invention is produced by using polyamic acid as a precursor. The polyamic acid may be produced by any known method. Typically, substantially equimolar amounts of an aromatic acid dianhydride and aromatic diamine are dissolved in an organic solvent to prepare a polyamic acid organic solvent solution, and this solution is stirred under controlled temperature conditions until polymerization of the acid dianhydride and the diamine is completed. The polyamic acid solution is usually obtained at a concentration of 5 to 35 wt % and preferably 10 to 30 wt %. A solution having a concentration within this range has an adequate molecular weight and an adequate solution viscosity.

Various known processes and combinations of these processes may be employed as the polymerization process. The key feature of the polymerization process for producing polyamic acid is the order of adding the monomers. The physical properties of the resulting polyimide are adjusted by controlling the order of adding the monomers.

Thus, in the present invention, any process of adding monomers may be employed for producing the polyamic acid. Representative examples of the polymerization processes are as follows:

1) A process including dissolving an aromatic diamine in an organic polar solvent and reacting the aromatic diamine with a substantially equimolar amount of an aromatic tetracarboxylic dianhydride to conduct polymerization;

2) A process including reacting an aromatic tetracarboxylic dianhydride and fewer moles of an aromatic diamine in an organic polar solvent to prepare a prepolymer having acid anhydride groups at the both ends and polymerizing the prepolymer with an aromatic diamine so that the aromatic tetracarboxylic dianhydride and the aromatic diamine are substantially equimolar over the whole process;

3) A process including reacting an aromatic tetracarboxylic dianhydride and excess moles of an aromatic diamine in an organic polar solvent to prepare a prepolymer having amino groups at the both ends, adding an additional aromatic diamine to the prepolymer, and then polymerizing the resulting mixture with an aromatic tetracarboxylic dianhydride so that the aromatic tetracarboxylic dianhydride and the aromatic diamine are substantially equimolar over the whole process of polymerization;

4) A process including dissolving and/or dispersing an aromatic tetracarboxylic dianhydride in an organic polar solvent and polymerizing the aromatic tetracarboxylic dianhydride with a substantially equimolar amount of an aromatic diamine; and 5) A process including reacting a substantially equimolar mixture of an aromatic tetracarboxylic dianhydride and an aromatic diamine in an organic polar solvent to conduct polymerization.

Any one or combination of these processes may be employed.

The polyimide resin that constitutes the non-thermoplastic polyimide film of the present invention contains a thermoplastic polyimide block component in the molecule, but is designed so that the film functions as a non-thermoplastic polyimide film as a whole. A preferable polymerization process for obtaining such a polyimide resin is a process including preparing a block component of the thermoplastic polyimide precursor and subsequently preparing a precursor of the non-thermoplastic polyimide using the remaining diamine and/or acid dianhydride. This process is ideal for preparing the block component. Here, it is preferable to adopt any partial combination of two or more of the processes 1) to 5).

For example, in the process 2) or 3) above, the prepolymer may be made by controlling the composition so that a thermoplastic polyimide is yielded by reacting equimolar amounts of the aromatic tetracarboxylic dianhydride and the aromatic diamine compound, and adequate aromatic tetracarboxylic dianhydride and aromatic diamine compound used in the entire process may be selected so that the final product, polyimide, exhibits non-thermoplastic properties.

For example, a polyamic acid solution may be obtained as follows: After dissolving 2,2-bis[4-(4-aminophenoxy)phenyl]propane (BAPP) in DMF, i.e., N,N-dimethylformamide, pyromellitic dianhydride (PMDA) and 3,3',4,4'-benzophenonetetracarboxylic dianhydride (BTDA) are added so that the total amount of anhydride is smaller relative to BAPP to prepare a thermoplastic polyimide block component. After that, p-phenylene diamine (p-PDA) is dissolved in the resulting solution, and PMDA is added to the resulting solution so that the total of the acid dianhydride used in the entire process is substantially equimolar to the amount of diamine. Thereby, a polyamic acid solution is obtained.

Here, the "thermoplastic polyimide block component" refers to a component that gives a film that softens and does not retain its original shape after 1 minute of heating at 450° C. on a fixing frame. There are two types of evaluation of a polyimide block component depending on its purpose. One evaluation is for judgment of whether the polyimide block component is thermoplastic, and another is for further determination of how thermoplastic the polyimide block component is. For purposes of evaluation of whether a polyimide block component is thermoplastic, a block component film is prepared by reacting the amounts of dianhydride and diamine compounds that constitute the block component, and completing formation of the film by adding sufficient amount of additional dianhydride or additional diamine so that equimolar amounts of dianhydride and diamine are present in the composition, thereby forming a block component film (hereinafter, this film is referred to as "the polyimide film composed of the thermoplastic polyimide block component").

The sample that is representative of the block component for evaluation purposes can be prepared in two different ways. In a first evaluation sample preparation, the additional dianhydride or diamine used to complete the film formation of the block component is selected from the dianhydrides or diamines already used in the proposed thermoplastic polyimide block component. This first sample preparation advantageously provides an excellent model of the character of the block component. Where there is more than one dianhydride or diamine used in the proposed thermoplastic polyimide block component, the dianhydride or diamine used to complete the film formation is that which contributes the highest Tg to the polyimide film composed of the thermoplastic polyimide block component. In a second evaluation sample preparation, the additional dianhydride or diamine used to complete the film formation is selected from pyromellitic acid dianhydride (in the case of the compound having diamine functionality) or p-phenylenediamine (in the case of the compound having acid dianhydride functionality). This second sample preparation has the advantage of providing a standard test for ease of comparison of different proposed thermoplastic polyimide block components. Unless otherwise indicated, this second sample preparation is intended for use in evaluation of all proposed thermoplastic polyimide block components to determine if the block component is thermoplastic, and additionally for further determination of how thermoplastic the polyimide block component is.

For purposes of evaluation of how thermoplastic the polyimide block component is, the polyimide film composed of the thermoplastic polyimide block component should be prepared at a low baking temperature by a known method, for example, baking temperature of 300° C. and baking time of 15 minutes. If a polyimide block component film for evaluation can not be obtained due to melting at even such a low baking temperature, the block component used therein is deemed to have 300° C. or less thermoplastic characteristics. If a polyimide block component film for evaluation can be obtained, the obtained film is then to be heated up to melting. Thus the melting temperature of the film can be determined. It is preferable that the melting temperature determined by such a procedure is in a range of 250° C. to 450° C., preferably, in a range of 300° C. to 400° C.

When the melting temperature of the polyimide block component film is excessively low, it becomes difficult to produce an end product non-thermoplastic polyimide film. When the melting temperature of the polyimide block component film is excessively high, high adherability, which is the advantageous feature of the present invention, is rarely obtainable.

The thermoplastic polyimide block component is preferably present in an amount of 20 to 60 mol %, more preferably 25 to 55 mol %, and most preferably 30 to 50 mol % of the entire polyimide.

When the content of the thermoplastic polyimide block component is below this range, high adherability may not be easily achieved, and when the content of the thermoplastic polyimide block component is above this range, it becomes difficult to obtain a non-thermoplastic polyimide film as an end product.

For example, when the polymerization process described in 2) is employed, the content of the thermoplastic polyimide block component is determined by the following equation (1):

$$\text{(Thermoplastic block component content)} = a/Q \times 100 \quad (1)$$

wherein a is the amount (mol) of the acid dianhydride component used in producing the thermoplastic polyimide block component, and Q is the total amount of the acid dianhydride component (mol).

When the polymerization process described in 3) is employed, the content of the thermoplastic polyimide block component is determined by the following equation (2):

$$\text{(Thermoplastic block component content)} = b/P \times 100 \quad (2)$$

wherein b is the amount (mol) of the diamine component used in producing the thermoplastic polyimide block component, and P is the total amount (mol) of the diamine.

The number n of the repeating units of the thermoplastic block component is preferably 3 to 99 and more preferably 4 to 90. When n is below this range, high adherability is not easily obtained, and the moisture expansion coefficient tends to increase. When n is beyond this range, the storage stability of the polyimide precursor solution tends to decrease, and the reproducibility of polymerization tends to decrease. For purposes of the present invention, the repeating units of the block component are units of diamine and acid dianhydride that may be the same or different from each other. These repeating units may be randomly arranged in the thermoplastic block component, regularly arranged or a mixture of random and regular arrangement within the thermoplastic block component.

The thermoplastic polyimide block component in the present invention is preferably one that gives a polyimide film having a glass transition temperature (Tg) in the range of 150° C. to 300° C. when the film is made by the above-described process. The glass transition temperature Tg can be determined based on the inflection point of the storage modulus determined with a dynamic viscoelasticity analyzer (DMA) or the like.

The invention may be described in an alternative matter by discussing the polyimide resin by reference to residue units of the polyimide resin. Thus, in another embodiment of the present invention, a non-thermoplastic polyimide film is provided comprising a non-thermoplastic polyimide resin having at least one residue unit derived from a compound having diamine functionality and at least one residue unit derived from a compound having acid dianhydride functionality. In this polyimide resin, either the residue unit derived from a compound having diamine functionality or the residue unit derived from a compound having acid dianhydride functionality has at least one amic acid group and exhibits a thermoplastic character when bound linearly using pyromellitic acid dianhydride (in the case of the compound having diamine functionality) or p-phenylenediamine (in the case of the compound having acid dianhydride functionality) and imidized.

Similarly, in another embodiment of the present invention a non-thermoplastic polyimide film is provided comprising a non-thermoplastic polyimide resin having at least one residue unit derived from a compound having diamine functionality and at least one residue unit derived from a compound having acid dianhydride functionality. In this polyimide resin, either the residue unit derived from a compound having diamine functionality or the residue unit derived from a compound having acid dianhydride functionality has at least one imide group and exhibits a thermoplastic character when bound linearly using pyromellitic acid dianhydride (in the case of the compound having diamine functionality) or p-phenylenediamine (in the case of the compound having acid dianhydride functionality) and imidized.

The monomers that form the thermoplastic polyimide block component of the present invention will now be described. The thermoplastic polyimide block component comprises the reaction product of diamines and acid anhydrides that are selected so that, as a whole, the component exhibits a thermoplastic character. The main components of the thermoplastic polyimide block component are selected from diamines and acid dianhydrides that are relatively non-rigid in structure and contribute a thermoplastic aspect to the resin. Ancillary components may be any material suitably incorporated in a polyimide resin. Examples of ancillary components of the thermoplastic polyimide block component include diamines and acid dianhydrides that are relatively rigid in structure, so long as such ancillary components are not present in an amount that would frustrate the purpose of incorporating a thermoplastic polyimide block component in the polyimide resin as described herein. It will now be understood that incorporation of a large amount of, for example, a rigid diamine, could adversely affect the properties of the thermoplastic polyimide block.

Preferable examples of the diamine main component include 4,4'-diaminodiphenylpropane, 4,4'-diaminodiphenylmethane, 4,4'-diaminodiphenyl sulfide, 3,3'-diaminodiphenylsulfone, 4,4'-diaminodiphenylsulfone, 4,4'-oxydianiline, 3,3'-oxydianiline, 3,4'-oxydianiline, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene(p-phenylenediamine), bis{4-(4-aminophenoxy)phenyl}sulfone, bis{4-(3-aminophenoxy)phenyl}sulfone, 4,4'-bis(4-aminophenoxy)biphenyl, 4,4'-bis(3-aminophenoxy)biphenyl, 1,3-bis(3-aminophenoxy)benzene, 1,3-bis(4-aminophenoxy)benzene, 1,3-bis(4-aminophenoxy)benzene, 1,3-bis(3-aminophenoxy)benzene, 3,3'-diaminobenzophenone, 4,4'-diaminobenzophenone, and 2,2-bis(4-aminophenoxyphenyl)propane. These may be used alone or in combination. The examples provided above are for the main component. Any type of diamine may be used as the auxiliary component. Among these compounds, 4,4'-bis(4-aminophenoxy)biphenyl, 4,4'-bis(3-aminophenoxy)biphenyl, 1,3-bis(3-aminophenoxy)benzene, 1,3-bis(4-aminophenoxy)benzene, 1,3-bis(4-aminophenoxy)benzene, 1,3-bis(3-aminophenoxy)benzene, and 2,2-bis(4-aminophenoxyphenyl)propane are particularly preferable as the diamine.

Examples of the diamine as ancillary components include p-phenylene diamine or its derivative or benzidine or its derivative.

Preferable examples of the acid component constituting the thermoplastic polyimide precursor block component include, 3,3',4,4'-benzophenonetetracarboxylic dianhydride, 3,3',4,4'-biphenyltetracarboxylic dianhydride, and 4,4'-oxydiphthalic dianhydride. These compounds may be used alone or in combination. In the present invention, it is preferable to use at least one acid dianhydride selected from the group consisting of 3,3',4,4'-benzophenonetetracarboxylic dianhydride, 3,3',4,4'-biphenyltetracarboxylic dianhydride, and 4,4'-oxydiphthalic dianhydride.

By using these acid dianhydrides, high adherability to the adhesives, which is the advantage of the present invention, can be easily achieved.

Examples of the preferable acid component as ancillary components include pyromellitic dianhydride.

Preferable examples of the diamine and/or the acid dianhydride used in producing the non-thermoplastic polyimide precursor by reaction with the thermoplastic polyimide precursor block component are now described. Since properties change with the combination of the diamine and the acid dianhydride, it is not feasible to establish a general limitation. However, the main component of the diamine is preferably a rigid component, such as p-phenylene diamine or its derivative or benzidine or its derivative. The diamine having the rigid structure can impart non-thermoplasticity and high elasticity modulus. The acid component preferably contains pyromellitic dianhydride as the main component. As is well known in the art, pyromellitic dianhydride easily gives a non-thermoplastic polyimide due to its rigid structure. In this manner, the molecular design is determined so that non-thermoplasticity is imparted to the end product polyimide film.

Whether the resulting polyimide film is thermoplastic or not is determined by the following procedure. The polyimide film is fixed onto a metal frame and heated at 450° C. for 1 minute. The film is assumed to be non-thermoplastic when the heated film retains the original film shape, i.e., when the heated film undergoes no relaxing or melting.

The linear expansion coefficient of the non-thermoplastic polyimide film of the present invention is preferably 10 to 20 ppm. The moisture expansion coefficient of the film is preferably 13 ppm or less. The elasticity modulus of the film is preferably 5 to 10 GPa. These physical properties usually change depending on the composition. In one aspect, it is possible to control the physical properties by changing the choice of the thermoplastic block component of the present invention.

In the present invention, from the standpoint of simplicity of the polymerization control and convenience of the facility, it is preferable to employ a polymerization process in which the non-thermoplastic polyimide precursor is prepared by adding a diamine and/or an acid dianhydride in adequately designed molar fractions after the synthesis of the thermoplastic polyimide precursor block component.

Any solvent that dissolves the polyimide precursor (hereinafter also referred to as "polyamic acid") may be used in the synthesis of the polyamic acid. Preferable examples include amide solvents such as N,N-dimethylformamide, N,N-dimethylacetamide, and N-methyl-2-pyrrolidone. N,N-Dimethylformamide and N,N-dimethylacetamide are particularly preferable.

A filler may be added to improve various properties of the film, such as slidability, thermal conductivity, electrical conductivity, corona resistance, and loop stiffness. The filler may be any but preferably silica, titanium oxide, alumina, silicon nitride, boron nitride, calcium hydrogen phosphate, calcium phosphate, or mica.

The diameter of the filler particles may be determined based on the film properties to be modified and the type of filler, and is thus not particularly limited. The average particle diameter is usually 0.05 to 100 μm, preferably 0.1 to 75 μm, more preferably 0.1 to 50 μm, and most preferably 0.1 to 25 μm. When the average diameter is below this range, the effect of modification is not readily exhibited. At an average diameter beyond this range, the surface quality and/or the mechanical properties may be significantly degraded. The amount of the filler to be added is determined based on the film properties to be modified and the diameter of the filler particles and is thus not particularly limited. The amount of the filler added is usually 0.01 to 100 parts by weight, preferably 0.01 to 90 parts by weight, and more preferably 0.02 to 80 parts by weight per 100 parts by weight of polyimide. At a filler content below this range, the effect of the modification by the use of the filler may not be sufficiently exhibited. At a filler content above this range, the mechanical properties of the film may be significantly degraded.

The filler may be added by any method. The examples of the method include:
1) Method of adding the filler to the polymerization solution before or during the polymerization;
2) Method of adding and kneading the filler with a three-shaft roller after completion of the polymerization; and
3) Method of combining a polyamic acid organic solvent solution with a dispersion containing the filler prepared in advance.

It is preferable to employ the method of combining the polyamic acid solution with the filler-containing dispersion, in particular, a method of combining the polyamic acid solution with the dispersion immediately before the film forming since contamination of the manufacturing line by the filler is least. In preparing the filler-containing dispersion, the same solvent as the polymerization solvent for the polyamic acid is preferably used. In order to sufficiently disperse the filler and stabilize the dispersion state, a dispersant, a thickener, or the like may be used in amounts that do not adversely affect the properties of the film.

A known process may be employed to produce a polyimide film from the polyamic acid solution. In particular, a thermal imidization process and a chemical imidization process are available. Either process may be used to produce the film; however, the chemical imidization process tends to produce a polyimide film having various properties preferred in the present invention.

The process for producing a polyimide film particularly preferred in the present invention preferably includes the steps of:
a) reacting an aromatic diamine and an aromatic tetracarboxylic dianhydride in an organic solvent to yield a polyamic acid solution;
b) flow-casting a film-forming dope containing the polyamic acid solution onto a support;
c) heating the cast dope on the support and peeling off the resulting gel film from the support; and
d) further heating and drying the gel film to imidize the remaining amic acid.

In the steps described above, a curing agent including a dehydrator, e.g., an acid anhydride such as acetic anhydride; and an imidization catalyst, e.g., a tertiary amine such as isoquinoline, β-picoline, or pyridine, may be used.

A process for producing a polyimide film according to a preferred embodiment of the present invention, which is a chemical imidization process, will now be described as an example. It should be understood that the invention is not limited by the examples below.

The film-forming conditions and heating conditions vary depending on the type of polyamic acid, the thickness of the film, and the like.

A dehydrator and an imidization catalyst are mixed in a polyamic acid solution at low temperature to prepare a film-forming dope. The film-forming dope is then cast onto a support, such as a glass plate, an aluminum foil, an endless stainless steel belt, or a stainless steel drum, to prepare a film, and the film is heated at 80° C. to 200° C., preferably at 100° C. to 180° C. to activate the dehydrator and the imidization catalyst. The resulting film thereby partly cured and/or dried is then separated from the support to obtain a polyamic acid film (hereinafter referred to as "gel film").

The gel film is in the intermediate stage of curing the polyamic acid to a polyimide and has a self-supporting ability. The volatile component content in the gel film determined by the following equation (3) is 50 to 500 percent by weight:

$$(A-B) \times 100 / B \tag{3}$$

wherein A is the weight of the gel film, and B is the weight of the gel film after 20 minutes of heating at 450° C. The volatile component content is usually 5 to 500 percent by weight, preferably 5 to 200 percent by weight, and more preferably 5 to 150 percent by weight. A film satisfying this range is preferably used; otherwise, problems such as film breaking during the baking step, uneven color tone due to uneven drying, variations in characteristics, and the like may occur.

The amount of the dehydrator used is preferably 0.5 to 5 mol and more preferably 1.0 to 4 mol per mole of the amic acid unit in the polyamic acid.

The amount of the imidization catalyst is 0.05 to 3 mol and preferably 0.2 to 2 mol per mole of the amic acid unit in the polyamic acid.

When the content of the dehydrator and the imidization catalyst is below this range, chemical imidization proceeds insufficiently. Thus, breaking may occur during the baking, or mechanical strength may be reduced. When the content is beyond this range, the progress of imidization is excessively accelerated, and it may be difficult to satisfactorily cast the solution into a form of film.

A polyimide film of the present invention is obtained by fixing the ends of the gel film to dry the film without shrinkage during the curing and to thereby remove water, the residual solvent, the residual converting agent, and the catalyst. Then the residual amic acid is completely imidized to give a polyimide film of the present invention.

Here, it is preferable to finally heat the film at a temperature in a range of 400° C. to 650° C. for 5 to 400 seconds. If the temperature is over this range and/or if the heating time is beyond this range, heat deterioration of the film may occur. In contrast, if the temperature is below this range and/or if the heating time is below this range, expected effects may not be exhibited.

In order to reduce the internal stress remaining in the film, it is possible to heat the film under the lowest possible tension required for film transfer. The heating process may be conducted in the film-forming process; alternatively, a separate heating process may be provided. The heating conditions vary depending on the properties of the film or the device used. Although no general limitation can be introduced, the temperature of the heating process is usually in the range of 200° C. to 500° C., preferably 250° C. to 500° C., and most preferably 300° C. to 450° C. and the heating time is usually 1 to 300 seconds, preferably 2 to 250 seconds, and most preferably about 5 to 200 seconds, for reducing the internal stress.

The polyimide film produced as such is a non-thermoplastic polyimide film that contains a non-thermoplastic polyimide resin having a thermoplastic polyimide-derived block component. This fact can be indirectly confirmed by comparing the physical properties according to the technique below. The technique for confirming the presence of a thermoplastic polyimide-derived block component in a non-thermoplastic polyimide film is as follows:

1) The monomer components of the non-thermoplastic polyimide film are analyzed with liquid chromatography by decomposing polyimide with an alkali such as hydrazine. When the film contains additives, such as a filler, the types and amounts of such additives are determined.
2) The following random polymerization is conducted for a designated composition:
    i) The entire diamine is dissolved in DMF and the resulting solution is cooled in a 0° C. ice bath;
    ii) To the resulting solution in the ice bath, powder of an acid dianhydride is gradually and carefully added under stirring so that no sedimentation occurs. A polyamic acid solution having a viscosity of 2,500 to 4,000 poise (23° C.) is obtained as a result. When two or more acid dianhydrides are used, the dianhydrides are mixed as powder and then added.
3) A film is made by the following process:
    i) In a 500 cc of polyethylene container, 100 g of the polyamic acid solution is weighed and cooled to about 5° C. When a filler is to be used, the filler is preliminarily dispersed in the polyamic acid solution.
    ii) To 50 g of the polyamic acid solution, an imidization agent cooled to −10° C. and containing DMF and 0.8 mol of isoquinoline and 2 mol of acetic anhydride per mole of amic acid is added, and the resulting mixture is rapidly stirred.
    iii) The solution resulting from ii) is degassed by centrifugation under cooling.
    iv) The solution resulting from iii) is flow-cast onto an aluminum foil using a comma coater.
    v) The cast solution and the aluminum foil carrying the cast solution are dried at 120° C. for 2 minutes, and the resulting gel film is peeled off from the aluminum foil and fixed onto a metal fixing frame. Here, caution must be paid not to shrink the gel film.
    vi) The gel film fixed on the metal fixing frame is heated at 300° C. for 1 minute, at 400° C. for 1 minute, and at 450° C. for 1 minute in a preliminarily heated hot-air circulation oven, and is separated from the fixing frame to obtain a polyimide film having a thickness of 25 µm.
4) The comparison of the physical properties between the film thus obtained (hereinafter also referred to as the "comparative film") and the film prepared by the polymerization according to the present invention in which the thermoplastic polyimide block component is incorporated (hereinafter also referred to as the "inventive film") finds the following features:
    i) The inventive film has an elasticity modulus higher than that of the comparative film by at least 0.3 GPa and in particular by at least 1 GPa.
    ii) The inventive film has a linear expansion coefficient and moisture expansion coefficient smaller than those of the comparative film by at least 1 ppm and in particular by at least 3 ppm.
    iii) The both films maintain substantially the same tensile elongation.
    iv) The storage elasticity modulus of the inventive film at 380° C. determined by dynamic viscoelasticity analysis is lower than that of the comparative film by at least 0.1 GPa and in particular by at least 0.3 GPa.
    v) The tan δ peak value of the inventive film is larger than that of the comparative film by at least 0.01 and in particular by at least 0.02.

EXAMPLES

The present invention will now be described in specifics by way of examples. It is to be understood that the present invention is not limited to these examples.

The methods for evaluating the glass transition temperature of a thermoplastic polyimide, the rate of change in dimensions of a flexible laminate, and the metal foil peel-strength in SYNTHETIC EXAMPLES, EXAMPLES, and COMPARATIVE EXAMPLES are as follows:

(Metal Foil Peel-Strength: Bonding Strength)

In accordance with Japanese Industrial Standard C6471, "6.5. Peel Strength", a sample was prepared and a metal foil portion 5 mm wide was peeled at a peeling angle of 180° C. and 50 mm/min to determine the load.

(Elasticity Modulus and Elongation)

The elasticity modulus and elongation were measured according to the standard D882 of American Society of Testing and Materials (ASTM).

(Linear Expansion Coefficient)

The linear expansion coefficient at 50° C. to 200° C. was conducted with a thermomechanical analyzer TMA120C produced by Seiko Instruments Inc., by heating a sample (3 mm in width and 10 mm in length) at a temperature ranging from 10° C. to 400° C. at a rate of 10° C./min under a load of 3 g, cooling the sample to 10° C., and again heating the sample at 10° C./min. The thermal expansion coefficients at 50° C. and 200° C. measured during the second heating were averaged to determine the linear expansion coefficient.

(Moisture Expansion Coefficient)

The length (L1) of a film was measured at 50° C. and 30% Rh. Subsequently, the humidity was increased to 80% Rh, and the length (L2) of the film at 50° C. and 80% Rh was measured. The moisture expansion coefficient was determined by the following equation:

Thermal Expansion Coefficient (ppm)=$(L2-L1)/L1/(80-30)\times 10^6$ (Dynamic Viscoelasticity Measurement (storage modulus and tan δ peak value))

A sample (9 mm in width and 40 mm in length) was measured with DMS200 produced by Seiko Instruments Inc., at a frequency of 5 Hz and a heating rate of 3° C./min in the temperature range of 20° C. to 400° C. The temperature at the inflection point of a curve indicating the storage modulus plotted versus temperature was assumed as the glass transition temperature.

(Identification of Thermoplasticity)

A polyimide film containing a thermoplastic polyimide block component was prepared at a maximum baking temperature of 300° C. for a baking time of 15 minutes. The film was fixed on a metal fixing frame and heated at 450° C. for 1 minute. The film was assumed to be thermoplastic when the film softened and did not retain its original shape.

Reference Example 1

Synthesis of Thermoplastic Polyimide Precursor

To a 2,000 mL glass flask, 780 g of DMF and 115.6 g of 2,2-bis[4-(4-aminophenoxy)phenyl]propane (BAPP) were added. While the resulting mixture was being stirred in a nitrogen atmosphere, 78.7 g of 3,3'4,4'-biphenyltetracarboxylic dianhydride (BPDA) was gradually added to the mixture. Subsequently, 3.8 g of ethylene bis(trimellitic monoester anhydride) (TMEG) was added, and the resulting mixture was stirred in an ice bath for 30 minutes. A solution of 2.0 g of TMEG in 20 g of DMF was separately prepared and gradually added to the reaction solution while monitoring the viscosity under stirring. The addition and the stirring were ceased when the viscosity reached 3,000 poise. A polyamic acid solution was thereby obtained.

The polyamic acid solution was flow-cast on a 25 μm PET film (Cerapeel HP, produced by Toyo Metallizing Co., Ltd.) so that the final thickness was 20 μm, and dried at 120° C. for 5 minutes. The resulting self-supporting film after the drying was peeled from the PET film, fixed onto a metal pin frame, and dried at 150° C. for 5 minutes, at 200° C. for minutes, at 250° C. for 5 minutes, and at 350° C. for 5 minutes to give a single layer sheet. The glass transition temperature of the thermoplastic polyimide was 240° C. This film was fixed on a metal frame and was heated at 450° C. for 1 minute. The film did not retain the original shape and was thus found to be thermoplastic.

(Evaluation of Adherability)

As the preliminary treatment, a polyimide film was surface-treated at a corona density of 200 W·min/m².

The polyamic acid solution obtained in REFERENCE EXAMPLE 1 was diluted with DMF to a solid content of 10 wt %. The resulting solution was applied onto both sides of the surface-treated polyimide film so that the final thickness of the thermoplastic polyimide layer (adhesive layer) was 4 μm on each side and heated at 140° C. for 1 minute. Subsequently, the film was passed through a far infrared heating furnace at an atmosphere temperature of 390° C. for 20 seconds to conduct thermal imidization and to thereby obtain a heat-resistant adhesive film. An 18 μm rolled copper foil (BHY-22B-T, produced by Japan Energy Corporation) was placed on each side of the resulting adhesive film, and then a protective material (Apical 125NPI produced by Kaneka Corporation) was placed on each copper foil. Thermal lamination was conducted with a thermal roll laminator at a lamination temperature of 360° C., a lamination pressure of 196 N/cm (20 kgf/cm), and a lamination rate of 1.5 m/min. An FCCL was obtained as a result. In accordance with JIS C6471, "6.5 Peel Strength", a sample was taken from the FCCL, and the metal foil portion of 5 mm in width was peeled at a peeling angle of 180° and a peeling rate of 50 mm/min to determine the load.

A FCCL prepared as described above but without surface-treatment was evaluated in the same manner as described above.

Example 1

In 546 g of N,N-dimethylformamide (DMF) cooled to 10° C., 46.43 g of 2,2-bis(4-aminophenoxyphenyl)propane (BAPP) was dissolved. To this solution, 9.12 g of 3,3',4,4'-benzophenonetetracarboxylic dianhydride (BTDA) was added and dissolved. Then, 16.06 g of pyromellitic dianhydride (PMDA) was added and the resulting mixture was stirred for 30 minutes to obtain a thermoplastic polyimide precursor block component.

In this solution, 18.37 g of p-phenylenediamine (p-PDA) was dissolved, and then 37.67 g of PMDA was added to the resulting solution and dissolved by stirring for one hour. A separately prepared DMF solution of PMDA (PMDA 1.85 g/DMF 24.6 g) was carefully added to the resulting solution, and the addition was ceased when the viscosity reached about 3,000 poise. Stirring was continued for 1 hour to obtain a polyamic acid solution having a solid content of about 19 wt % and a rotational viscosity at 23° C. of 3,400 poise.

To 100 g of this polyamic acid solution, 50 g of a curing agent composed of acetic anhydride/isoquinoline/DMF (ratio of 18.90/7.17/18.93 based on weight) was added, and the resulting mixture was stirred and degassed at a temperature of 0° C. or lower. The mixture was then flow-cast on an aluminum foil using a comma coater. This resin film was heated at 130° C. for 100 seconds. The resulting self-supporting gel film (residual volatile component content: 45 wt %) was peeled from the aluminum foil, fixed on a metal frame, and dried at 300° C. for 20 seconds, 400° C. for 20 seconds, and 500° C. for 20 seconds for imidization to obtain a polyimide film having a thickness of 25 μm. The film properties and the adhesive properties of the film obtained are shown in Table 1.

A polyamic acid with BAPP/BTDA/PMDA=46.43 g/9.12 g/18.53 g was flow-cast on a glass plate and baked at a maximum baking temperature of 300° C. for 15 minutes to produce a film. The film was fixed on a metal fixing frame, and heating the fixed film at 450° C. was attempted. However, the film became molten and did not retain its original shape. It was confirmed that the film had a thermoplastic block component.

Examples 2 and 3 and Comparative Examples 1 and 2

A polyimide film was prepared as in EXAMPLE 1 but with a different monomer ratio. In EXAMPLES 2 and 3, the confirmation of the thermoplastic block component was conducted as in EXAMPLE 1, and it was confirmed that the film had the thermoplastic block component.

Reference Example 1

In 546 g of N,N-dimethylformamide (DMF) cooled to 10° C., 46.43 g of 2,2-bis(4-aminophenoxyphenyl)propane (BAPP) and 18.37 g of p-phenylenediamine (p-PDA) were dissolved. To this solution, 9.12 g of 3,3',4,4'-benzophenonetetracarboxylic dianhydride (BTDA) and 53.73 g of pyromellitic dianhydride (PMDA) were added and dissolved by stirring for 1 hour. A separately prepared DMF solution of PMDA (PMDA 1.85 g/DMF 24.6 g) was carefully added to the resulting solution, and the addition was ceased when the viscosity reached about 3,000 poise. Stirring was continued for 1 hour to obtain a polyamic acid solution having a solid content of about 19 wt % and a rotational viscosity at 23° C. of 3,400 poise.

To 100 g of this polyamic acid solution, 50 g of a curing agent composed of acetic anhydride/isoquinoline/DMF (ratio of 16.96/8.58/24.46 based on weight) was added, and the resulting mixture was stirred and degassed at a temperature of 0° C. or lower. The mixture was then flow-cast on an aluminum foil using a comma coater. This resin film was dried at 120° C. for 2 minutes. The resulting gel film was peeled from the aluminum foil and carefully fixed on a metal fixing frame to avoid shrinkage. The gel film fixed onto the metal fixing frame was heated at 300° C. for 1 minute, at 400° C. for 1 minute, and at 450° C. for 1 minute in a preliminarily heated hot-air circulation oven, and was separated from the fixing frame to obtain a polyimide film having a thickness of 25 μm.

TABLE 1

| | EXAMPLE 1 | | EXAMPLE 2 | | EXAMPLE 3 | |
|---|---|---|---|---|---|---|
| Polymerization recipe | BAPP | 40 | BAPP | 50 | BAPP | 40 |
| | BTDA | 10 | BTDA | 40 | BTDA | 10 |
| | PMDA | 26 | PDA | 50 | PMDA | 22 |
| | PDA | 60 | PMDA | 60 | PDA | 60 |
| | PMDA | 64 | | | PMDA | 68 |
| No. of repeating units of block component | 9 | | 4 | | 4 | |
| Content (%) of thermoplastic block component | 40 | | 50 | | 40 | |
| Elasticity modulus (GPa) | 7.3 | | 6.1 | | 6.5 | |
| Elongation (%) | 45 | | 60 | | 48 | |
| Linear expansion coefficient (ppm) | 11 | | 22 | | 14 | |
| Moisture expansion coefficient (ppm) | 9 | | 11 | | 10 | |
| Tan δ peak value | 0.10 | | 0.13 | | 0.08 | |
| Storage modulus at 380° C. (Gpa) | 1.1 | | 0.9 | | 1.2 | |
| Bonding strength (N/cm) With corona treatment | 10.1 | | 15.5 | | 9.5 | |
| Without corona treatment | 6.5 | | 12.3 | | 5.7 | |

* In Example 1, the thermoplastic block component was composed of three components in the polymerization recipe, BAPP/BTDA/PMDA (monomer ration = 40/10/26) in Table 1.

In Example 2, the thermoplastic block component was composed of the two components in the polymerization recipe, BAPP/BTDA (monomer ratio=50/40) in Table 1.

In Example 3, the thermoplastic block component was composed of the three components in the polymerization recipe, BAPP/BTDA/PMDA (monomer ratio=40/10/22) in Table 1.

TABLE 2

| | COMPARATIVE EXAMPLE 1 | | COMPARATIVE EXAMPLE 2 | | REFERENCE EXAMPLE 1 | |
|---|---|---|---|---|---|---|
| Polymerization recipe | PDA | 60 | PDA | 60 | BAPP | 40 |
| | PMDA | 54 | BAPP | 40 | PDA | 60 |
| | BAPP | 40 | BTDA | 10 | BTDA | 10 |
| | BTDA | 10 | PMDA | 90 | PMDA | 90 |
| | PMDA | 36 | | | | |
| No. of repeating units of block component | | | | | | |
| Content (%) of thermoplastic block component | | | | | | |
| Elasticity modulus (GPa) | 7.1 | | 6.2 | | 6.0 | |
| Elongation (%) | 15 | | 45 | | 50 | |
| Linear expansion coefficient (ppm) | 10 | | 17 | | 15 | |
| Moisture expansion coefficient (ppm) | 9 | | 14 | | 13 | |
| Tan δ peak value | 0.10 | | 0.07 | | 0.07 | |
| Storage modulus at 380° C. (Gpa) | 1.1 | | 1.4 | | 1.8 | |
| Bonding strength (N/cm) With corona treatment | 5.3 | | 5.3 | | 8.5 | |
| Without corona treatment | 2.2 | | 3.1 | | 4.2 | |

The invention claimed is:

1. A non-thermoplastic polyimide film comprising: a non-thermoplastic polyimide resin having a block component derived from a thermoplastic polyimide, wherein the non-thermoplastic polyimide film, when fixed onto a metal frame and heated at 450° C. for 1 minute, retains its original film shape.

2. The non-thermoplastic polyimide film according to claim 1, wherein the thermoplastic block component is present in an amount of 20 to 60 mol % of the entire non-thermoplastic polyimide resin.

3. The non-thermoplastic polyimide film according to claim 1, wherein the diamine component in the thermoplastic polyimide block component contains 2,2-bis(4-aminophenoxyphenyl) propane.

4. The non-thermoplastic polyimide film according to claim 1, wherein the acid component in the thermoplastic polyimide block component contains a benzophenonetetracarboxylic acid and/or a biphenyltetracarboxylic acid.

5. The non-thermoplastic polyimide film according to claim 1, wherein the number n of repeating units of the thermoplastic polyimide block component is 3 to 99.

6. The on-thermoplastic polyimide film according to claim 5, wherein the number n of repeating units of the thermoplastic polyimide block component is 4 to 90.

7. The non-thermoplastic polyimide film according to claim 1, wherein the non-thermoplastic polyimide film is a polyimide film consisting of a non-thermoplastic polyimide resin having a block component derived from a thermoplastic polyimide.

8. The non-thermoplastic polyimide film according to claim 1, further comprising a filler.

9. The non-thermoplastic polyimide film according to claim 8, wherein the non-thermoplastic polyimide resin is 50 wt % or more of the film.

10. The non-thermoplastic polyimide film according to claim 8, wherein the filler is 50 wt % or less of the film.

11. The non-thermoplastic polyimide film according to claim 1, wherein the thermoplastic polyimide block component has a glass transition temperature in the range of 150° C. to 300° C.

12. A non-thermoplastic polyimide film comprising:
- a non-thermoplastic polyimide resin having at least one residue unit derived from a compound having diamine functionality and at least one residue unit derived from a compound having acid dianhydride functionality,
- wherein either the residue unit derived from a compound having diamine functionality or the residue unit derived from a compound having acid dianhydride functionality has at least one amic acid group and exhibits a thermoplastic character when bound linearly using pyromellitic acid dianhydride (in the case of the compound having diamine functionality) or p-phenylenediamine (in the case of the compound having acid dianhydride functionality) and then imidized
- wherein the non-thermoplastic polyimide film, when fixed onto a metal frame and heated at 450° C. for 1 minute, retains its original film shape.

13. A non-thermoplastic polyimide film comprising:
- a non-thermoplastic polyimide resin having at least one residue unit derived from a compound having diamine functionality and at least one residue unit derived from a compound having acid dianhydride functionality,
- wherein either the residue unit derived from a compound having diamine functionality or the residue unit derived from a compound having acid dianhydride functionality has at least one imide group and exhibits a thermoplastic character when bound linearly using pyromellitic acid dianhydride (in the case of the compound having diamine functionality) or p-phenylenediamine (in the case of the compound having acid dianhydride functionality) and then imidized,
- wherein the non-thermoplastic polyimide film, when fixed onto a metal frame and heated at 450° C. for 1 minute, retains its original film shape.

14. A non-thermoplastic polyimide film made from monomer components polymerized in an arrangement that provides thermoplastic polyimide regions having the following properties as compared to a comparative film having the same monomer components that are randomly polymerized:
- i) the non-thermoplastic polyimide film has an elasticity modulus higher than that of the comparative film by at least 0.3 GPa;
- ii) the non-thermoplastic polyimide film has a linear expansion coefficient and moisture expansion coefficient smaller than those of the comparative film by at least 1 ppm;
- iii) the non-thermoplastic polyimide film and the comparative film maintain substantially the same tensile elongation;
- iv) the storage elasticity modulus of the non-thermoplastic polyimide film at 380° C. determined by dynamic viscoelasticity analysis is lower than that of the comparative film by at least 0.1 GPa; and
- v) the tan δ peak value of the non-thermoplastic polyimide film is larger than that of the comparative film by at least 0.01.
- wherein the non-thermoplastic polyimide film, when fixed onto a metal frame and heated at 450° C. for 1 minute, retains its original film shape.

* * * * *

UNITED STATES PATENT AND TRADEMARK OFFICE
CERTIFICATE OF CORRECTION

PATENT NO. : 7,811,660 B2  Page 1 of 1
APPLICATION NO. : 11/698656
DATED : October 12, 2010
INVENTOR(S) : Kaneshiro et al.

It is certified that error appears in the above-identified patent and that said Letters Patent is hereby corrected as shown below:

On the Title Page
Item (63), Lefthand Column,
After the "Related U.S. Application Data", please add Item --(30) Foreign Priority Data
July 27, 2004    [JP]    Japan 2004-218685--

Signed and Sealed this

Twenty-first Day of December, 2010

David J. Kappos
*Director of the United States Patent and Trademark Office*